United States Patent [19]

Sepponen

[11] Patent Number: 4,654,595
[45] Date of Patent: Mar. 31, 1987

[54] METHOD OF ANALYZING PROPERTIES OF A MATTER OR A MAGNETIC FIELD

[75] Inventor: Raimo Sepponen, Helsinki, Finland

[73] Assignee: Instrumentarium Oy, Finland

[21] Appl. No.: 612,657

[22] Filed: May 21, 1984

[30] Foreign Application Priority Data

Jun. 23, 1983 [FI] Finland .................................. 832326
Oct. 19, 1983 [FI] Finland .................................. 833807

[51] Int. Cl.$^4$ .................................................. G01R 33/20
[52] U.S. Cl. ...................................... 324/309; 324/307
[58] Field of Search ................ 324/307, 309, 300, 310, 324/314

[56] References Cited

U.S. PATENT DOCUMENTS

| | | | |
|---|---|---|---|
| 4,443,760 | 4/1984 | Edelstein et al. | 324/309 |
| 4,471,306 | 9/1984 | Edelstein et al. | 324/309 |
| 4,521,733 | 6/1985 | Bottomley et al. | 324/309 |
| 4,536,712 | 8/1985 | Iwaoka et al. | 324/309 |
| 4,553,096 | 11/1985 | Randell | 324/309 |

FOREIGN PATENT DOCUMENTS 2946847 5/1980 Fed. Rep. of Germany .
81/02789 10/1981 PCT Int'l Appl. .
2057142 3/1981 United Kingdom .

Primary Examiner—Stewart J. Levy
Assistant Examiner—Kevin O'Shea
Attorney, Agent, or Firm—Andrus, Sceales, Starke & Sawall

[57] ABSTRACT

A nuclear magnetic resonance signal is collected from a target by using a special pulse sequence which is repeated and, between various repetitions, the relative temporal ratio of signal collection and excitation events is changed. The pulse sequence consists e.g. of the following actions: a target zone is first excited with a so-called 90° pulse followed by coupling of magnetic field gradients in a manner that re-excitation of the target with a 180° pulse serves to generate a so-called spin echo, which is stored and during which at least one magnetic field gradient is turned on. If the purpose is to image a three-dimensional target, e.g. the first excitation event can be effected by using so-called selective excitation and by using a gradient pulse orthogonal to the direction of a read gradient for phase encoding a nuclear system. Phase encoding can also be made in directions orthogonal to said read gradient and to each other to produce this way a complete three-dimensional local distribution of the chemical spectrum of a target.

29 Claims, 7 Drawing Figures

METHOD OF ANALYZING PROPERTIES OF A MATTER OR A MAGNETIC FIELD

BACKGROUND OF THE INVENTION

The present invention relates to a method for determination of the local distribution of nuclear magnetic resonance spectrum of the nucleus of an atom to be analysed and/or inhomogeneities in the magnetic field by employing NMR nuclear spin imaging methods.

Nuclear magnetic resonance phenomenon (hereinafter NMR) has been known since the 1940s. The first experiments were carried out by Bloch and Purcell in 1946. Since then, the phenomenon has been applied in the fields of physics, chemistry and medicine.

NMR is based on the fact that the nuclei of certain elements have a magnetic moment. Among these are e.g. $^1H$, $^{19}F$ and $^{31}P$, whose nuclear spin quantum number $I = \frac{1}{2}$. The magnetic moment $\mu$ of a nucleus is proportional to the spin quantum number I of the nucleus:

$$\mu = \gamma \, I, \quad (1)$$

wherein
$\gamma$ = a gyromagnetic ratio depending on nucleus
= $h/2\pi$; h is Planck's constant The behaviour of a cluster of nuclei in an external magnetic field can be analysed either by means of quantum mechanics or classical mechanics. The latter is a more perceptual approach. It can be presumed that nuclei are small bar magnets on which the rotation or spin of nuclei around their own axis generates not only a magnetic moment but also an impulse moment.

If a sample with a substantial number of e.g. $^{31}P$ atoms is placed in an external magnetic field $B_o$, the majority of magnetic moments of the nuclei of said atoms will be aligned parallel with said external magnetic field and the resultant will generate so-called net magnetization which is parallel to the external field. Said net magnetization can be deflected from the direction of the external magnetic field by exciting the sample with electromagnetic energy at a frequency which fulfils the resonance condition $$W_o = \gamma B_o = 2\pi f_o \quad (2)$$

$f_o$ = so-called Larmor frequency.

The deflected magnetization precesses around the direction of the external magnetic field at a frequency which corresponds to said Larmor frequency. This precessing magnetization can be detected by placing outside the target an induction coil for inducing a signal voltage having Larmor frequency and being proportional to the precessing net magnetization.

In order to detect the precession of nuclear magnetization by means of an induction coil, the magnetization precession of the nuclei must proceed phase-coherently. This status prevails immediately after the excitation pulse but, due to the relative interactions of the nuclei of a sample, the nuclei will be exposed to magnetic fields slightly different from one another and, thus, the precession frequencies thereof differ from each other and the precession coherence will decline. The decline of coherence leads to the decay of an inducing signal and this exponential process is characterized by a relaxation time $T_2$ (so-called spin-spin relaxation time).

The deflected magnetization returns gradually to the direction of the external magnetic field $B_o$, i.e. the nuclear system delivers to its environment the energy received thereby during the excitation pulse. The nature of this process is also exponential and it is characterized by a relaxation time $T_1$ (so-called spin-lattice relaxation time).

The magnetic fields created by the molecule and ambience also generate a plurality of resonance frequencies, i.e. a signal being induced has a spectrum which depends not only on polarizing magnetic field $B_o$ but also on the chemical properties of a sample, including physical state, molecular structure and other ingredients of a sample. The effect of a sample itself on the resonance spectrum is called a chemical shift, marked as $\delta$, which is measured as a frequency deviation relative to a known reference frequency. The reference frequency is obtained by measuring the resonance of a known material in the presently used field $B_o$.

Said frequency deviations are millionths of a basic frequency and, thus, $\delta$ is often quoted in units ppm (part per million).

In NMR spectroscopy, a sample is placed in a homogeneous magnetic field and the nuclei to be analysed are excited by means of a short-time radio-frequency pulse. Immediately after the excitation, a resonance signal inducing to a signal coil is amplified, detected, converted from analog to digital and stored in the memory of a computer. The computer subjects the stored signal to Fourier transformation, resulting in the spectrum of said signal. On the basis of the intensity of the components of a thus obtained spectrum and on the basis of the deviations from reference frequencies it is possible to conclude the molecular structure of a matter or to identify ingredients contained in the sample by comparing the obtained spectrum with tabulated spectra. The described method is called pulse NMR spectroscopy and it has been disclosed e.g. in the reference Ernst et al.: Rev. Scient. Instr. Vol. 37, 93, 1966.

In 1973, Professor Lauterbur was the first to introduce an idea of applying the NMR phenomenon to imaging or to mapping the distributions of concentrations and relaxation times of an atom to be analysed (Nature Vol. 242, Mar. 16, 1973, p. 190-191).

Hereinafter a method of mapping the distributions of NMR parameters will given a general term nuclear spin imaging method.

A plurality of nuclear spin imaging methods have been developed. These have been described e.g. in the following Patent publications: Ernst: U.S. Pat. No. 4,070,611, Mansfield: U.S. No. 4,165,479; Garroway et al: U.S. No. 4,021,726; Moore et al: No. 4,015,196; Hutchinson et al: WO No. 81/02789; Sepponen: FI appln. No. 824343. A review on various imaging methods has been disclosed e.g. in the reference Bottomley: Rev. Sci. Instruments, Vol. 53, 9 pp. 1319 . . . 1337, 1982.

These methods, as well as other nuclear spin imaging methods, are characterized in that, during the signal recording, there is placed over a zone to be imaged a magnetic field gradient or a so-called read out-gradient. A magnetic field gradient results in that the signal being recorded contains positional information as frequency-encoded but recording of a chemical spectrum without special arrangements is impossible.

One way of collecting the local distribution of the spectrum of a chemical shift has been disclosed in the reference P. Bendel et al: Journal of Magnetic Resonance, Vol. 38, 343 . . . 356, 1980. The described method is based on the mathematical processing of the signals recorded during oppositely directed magnetic field gradients so as to find out the spectral information. The mapping of NMR characteristics is based on repeatedly exciting a sample by a radio-frequency pulse, followed by recording a NMR signal while a magnetic field gradient is turned on. The direction of a gradient following each excitation differs from the preceding gradient and, thus, projections of a sample are obtained from different directions. The projections obtained are used to reconstruct, e.g. as described in the reference Brooks et al. (Radiology, Vol. 117, 561, 1975), the internal structure of a target. The spectroscopic information of a chemical shift, in turn, can be mathematically reconstructed because of the fact that the frequency deviation caused by a chemical shift does not depend on the direction of an external field gradient. This method requires highly complicated data processing as well as the use of projections for building an image. On the other hand, the method cannot be readily applied to other prior art imaging methods described, in addition to the above publications, in the reference Edelstein et al: Physics in Medicine et Biology, July 1980, No. 4, pp. 751 . . . 756.

Other approaches for the determination of the local distribution of a chemical shift is to selectively excite only those atomic nuclei of a component to be analysed, which have a certain chemical shift, and thereafter to record a nuclear magnetic resonance signal being induced. However, this method suffers from several major drawbacks. First of all, in order to determine the spectrum of a chemical shift, the imaging process must be repeated a number of times. Secondly, three-dimensional targets cannot be mapped by using a so-called selective excitation since, during the excitation phase, it is not possible to use a magnetic field gradient for limiting an imaging range. Naturally, it is plausible to employ methods suitable for three-dimensional imaging, one example of those having been described e.g. in the cited Patent publication Ernst: U.S. Pat. No. 4,070,611, Sepponen: FI appln. No. 824343, or Brown: U.S. Pat. No. 4,319,190. However, this only produces an image of one spectral component and, hence, the total imaging time becomes impractically long. Furthermore, the magnetic field of such apparatus must be highly homogeneous over the entire volume to be imaged which, e.g. when dealing with a human body, is technically very difficult or even practically impossible.

Moreover, the following Patent publications Abe et al: U.S. Pat. No. 3,932,805; Abe et al: U.S. Pat. No. 4,240,439; Damadian: U.S. 3,789,832; Damadian: DE(OS) No. 2 946 847; and Sepponen: FI 58868 disclose various methods of orientating an external magnetic field to be placed over a target in a manner that the resonance condition is only fulfilled within a limited range that can be shifted electrically or mechanically inside a target being analysed. A drawback in these methods is that, if the effort is made to map the local distribution of the nuclear magnetic spectrum of an element to be analysed, the target volume must be examined point by point. Thus, the analysis takes a long time and the movements of a target, such as respiration, peristalsis of the intestines etc., lead to inaccuracies in mapping. Instruments based on this method are at the moment manufactured e.g. by Oxford Instruments (England), whose "Topical Magnetic Resonance" apparatus, fitted with a superconductive magnet, is capable of producing a $^{31}P$-spectrum within a carefully restricted volume of a target.

It is also prior known to localize a volume from which a nuclear magnetic resonance spectrum is measured by means of a suitable signal coil. Thus, the geometry of a signal coil is used to restrict the zone from which a signal is received. By using the same signal coil also as an excitation coil and by changing the duration and/or amplitude of an excitation pulse, the mapping can be effected in the direction perpendicular to the plane of said signal coil. A drawback in this method is that, if it is desired to analyse areas far away from the signal coil, the positional accuracy deteriorates rapidly as the distance grows. In view of this, the method has been used e.g. for mapping the $^{31}P$-spectrum of cerebral cortex by means of surface coils from outside the skull.

Furthermore, the reference Brown U.S. Pat. No. 4,319,190 discloses mapping of a nuclear magnetic resonance spectrum in a manner that the signal is recorded without a magnetic field gradient (read gradient). A drawback in this method is a long imaging time. For example, for producing a $64 \times 64$ image it is necessary to collect $64^2$ signals and, if the repetition interval of pulses is 1 s, the imaging time will be 68 minutes.

The reference Burl et al: GB Patent application No. 2057142 anticipates a method wherein the signal is collected in a manner that the direction of a read gradient is repeatedly reversed and generated this way is a so-called spin-echo train which is so effected by a chemical shift that a chemical spectrum can be produced by carrying out the Fourier transform in the direction of said train. A drawback in this method is the relatively great gradient field strength, which is necessary and may involve health hazards and which, by increasing the band width of a signal, reduces the signal-to-noise ratio. In addition, the finite rise times of gradients result in phase errors in a signal to be collected.

Further known on the basis of the reference Cox and Styles: Journal of Magnetic Resonance Vol. 40, p. 209, 1980 is the application of a so-called "Rotating Frame Zeugmatography" method, disclosed in the reference Hoult: Journal of Magnetic Resonance Vol. 33, p. 103, 1979, to the mapping of the local distribution of a chemical shift. Drawbacks in this method include technical difficulties in the application thereof, e.g. generation of a required radio-frequency field gradient and the required high RF output especially in the case of a human body as well as the fact that the method is difficult or impossible to apply to a more than one-dimensional case.

A further reference Aue et al: Journal of Chemical Physics, Vol. 64, No. 5, Mar. 1, 1976, p. 2229, discloses a principle of two-dimensional spectroscopy, one application of which comprises also so-called Fourier imaging methods, said principle being applied to determination of the local distribution of a chemical shift in references Hall et al: Journal of Magnetic Resonance, Vol. 50, pp. 161 . . . 164, 1982 and Maudsley et al.: Journal of Magnetic Resonance, Vol. 51 pp. 147 . . . 152, 1983, which also have no magnetic field gradient coupled over a target during signal collection and which require a rather long imaging time.

The methods described in these references are very similar to that set forth in reference Brown: U.S. Pat. No. 4,319,190.

SUMMARY OF THE INVENTION

An object of the invention is to provide a novel and simple method for determination of the local distribution of the spectrum of said channel shift of a target, which method can be applied in a plurality of nuclear spin imaging methods and which is capable of providing within a reasonable imaging time a favourable signal-to-noise ratio. Another object of the invention is to provide a method that can be advantageously used for measuring of the inhomogeneities of a magnetic field and for homogenizing the magnet of e.g. a nuclear spin imaging apparatus or NMR spectrometer in the manufacture of such magnets and in connection with the installation of such an apparatus as well as for determination of the magnetization of a material to be analysed. Other objects and applications of the invention will become apparent from the following specification of the invention.

The objectives of the invention are achieved as set forth in the main claim and subclaims.

According to the invention, a nuclear magnetic resonance signal is collected from a target by using a special pulse sequence which is repeated and, between various repetitions, the relative temporal ratio of signal collection and excitation events is changed. Said pulse sequence consists e.g. of the following actions: a target zone is first excited with a so-called 90° pulse followed by coupling of magnetic field gradients in a manner that re-excitation of the target with a 180° pulse serves to generate a so-called spin echo, which is stored and during which at least one magnetic field gradient is turned on. If the purpose is to image a three-dimensional target, e.g. the first excitation event can be effected by using so-called selective excitation and by using a gradient pulse orthogonal to the direction of a read gradient for phase encoding a nuclear system. Phase encoding can also be made in directions orthogonal to said read gradient and to each other to produce this way a complete three-dimensional local distribution of the chemical spectrum of a target.

For example, the spectrum of protons of a biological tissue consists substantially of only two components, at the distance of circa 4 ppm from each other. Thus, it is sufficient to collect e.g. 8 samples from within the spectrum. Hence, the imaging time required by the method of the invention for producing 64×64 images will be 8×64 s or circa 8,5 minutes. The imaging time shall not grow longer if resolution is increased in the direction of the read gradient contrary to the method disclosed in reference Brown: U.S. Pat. No. 4,319,190 which would require an imaging time of 2 hours 17 minutes for producing 128×64 images.

Another advantage is that the method of the invention does not necessarily require gradient current sources capable of reversing the current, whereby the rates of changing a gradient field may be lower.

In addition to the mapping of chemical properties of a target, e.g. a human body or even a trunk of tree, the method of this invention can be preferably used for measuring the inhomogeneities of a magnetic field by utilizing a target which has homogeneous nuclear magnetic properties or is otherwise known.

It is further possible to apply the method of this invention in order to determine the distribution of the chemical spectrum of a body to be analysed by carrying out separately, according to the invention, the mapping of the distribution of a magnetic field used for the analysis by utilizing a homogeneous or otherwise known target and by using a thus obtained field map to correct the map obtained by means of the method of this invention of a target being analysed.

The method according to the invention can be further applied to homogenizing the magnet of e.g. a nuclear spin imaging apparatus or NMR spectrometer by effecting, repeatedly if necessary, the mapping of a magnetic field by means of a homogeneous or otherwise known target and by using the thus obtained information for setting the currents of special coil (shim coil-) systems intended e.g. for homogenizing a field or for determination of the number and location of ferromagnetic material fragments or for determination of the need for necessary ambient changes, such as the need for shifting various ferromagnetic objects.

The method according to the invention can be further applied for determination of the magnetization of a material to be analysed by utilizing a homogeneous or otherwise known target and by mapping, according to the method, the distribution of a magnetic field by changing, repeatedly if necessary, the position of a material to be analysed relative to said target and/or the amount of such material.

DESCRIPTION OF THE DRAWINGS

The following specification will deal with the principles of the invention which will be described in more detail with reference made to the accompanying drawing, in which.

DESCRIPTION OF THE PREFERRED EMBODIMENT

In FIGS. 1, 2, 4 and 5, the actions to be effected according to the invention are on one hand specified on different axes and further arranged in the direction of a time axis t as successive numbered phases. In the figures, RF designates a radio-frequency pulse for excitation of the nuclei to be analysed in a target area, said pulse being in practice either a so-called 90° pulse or a so-called 180° pulse. Magnetic field gradients are designated as Gx, Gy and Gz according to the axis corresponding to the direction thereof. The generated NMR signals are marked on S-axis and the recording moments of a signal are respectively marked on D-axis. The figures should only be understood as examples of various embodiments of the invention. The shapes and amplitudes and the relative durations of gradient pulses do not represent the only and always best combination of the invention. Selected as a means of illustration are xyz-coordinates and the necessary gradients are presented as components relative to these coordinates. This complies with the practice of today's nuclear spin imaging equipment for generating gradient fields by using three separate coil sets, the gradients generated thereby being orthogonal to each other. Naturally, it is possible to select some other mode of representation, such as a polar coordinate representation.

The representations describing Fourier methods employ as an example one way set forth in reference Sepponen: FI appln. No. 824343 of effecting phase coding of a nuclear system and phasing in the direction of a slice. Expansion of the methods to complete three-dimensional imaging is straight forward, as disclosed in the cited reference Sepponen FI appln. No. 824343.

Studied now is a target in which the density distribution of a nucleus is $A(x, y, z, \delta)$, wherein x, y, z are positional coordinates according to orthogonal Cartesian-coordinates and $\delta$ is the order of a chemical shift to be analysed. Studied for the sake of clarity is a one-dimensional density distribution $A(x, \delta)$.

Figure 1:
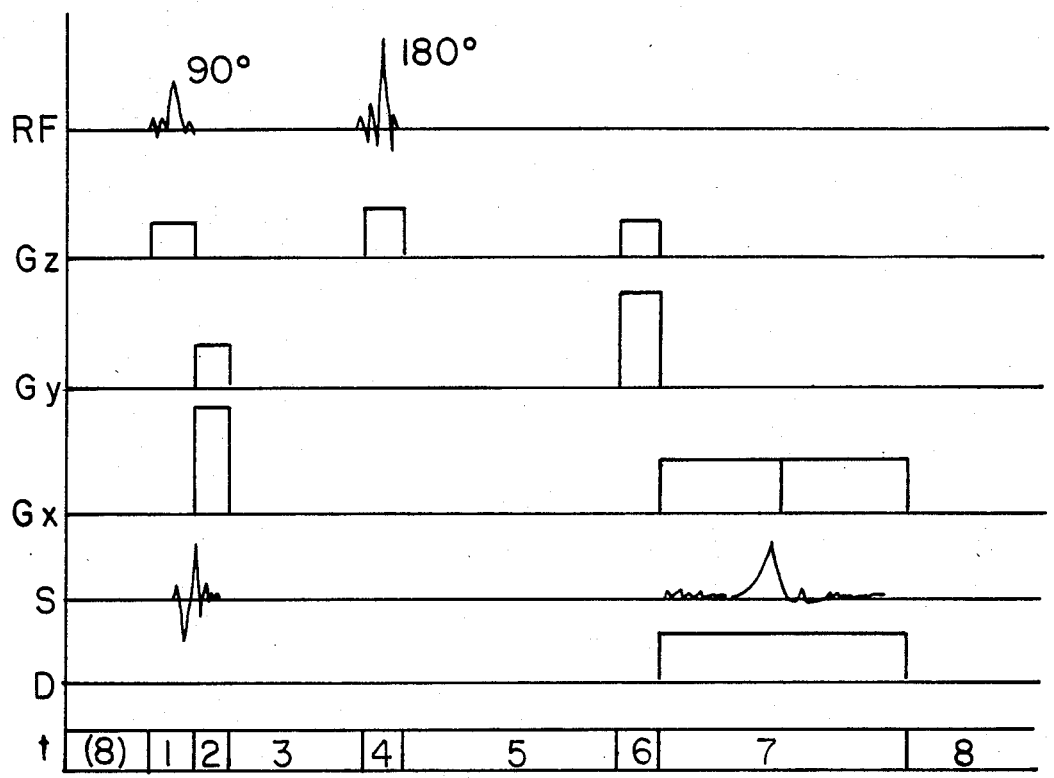
FIG. 1 shows the application of a method of the invention to a so-called 2-dimensional Fourier imaging method.

Referring to FIG. 1, the basic principles of the invention are first studied. In phase 1, when $t=0$, the nuclei of a target are excited with a 90° excitation pulse. In phase 2, an X-directed gradient Gx is placed over the target. If the time of analysis is short relative to the natural $T_2$ relaxation time of said nuclei, a signal induced by the excited nuclei is:

$$S(t) = \int_\delta \int_x A(x,\delta)e^{j(\gamma Gx + \delta + W_0)t} dx d\delta \quad (3)$$

wherein
$S(t)$ = inducing signal
$A(x,\delta)$ = density distribution
$W_0$ = Larmor frequency
$\gamma$ = gyromagnetic ratio
$G$ = field gradient
$\delta$ = spectral density for analysis
$t$ = time
$j = \sqrt{-1}$ When analysing a signal in a so-called rotating frame reference whose angular frequency is $W_0$, equation (3) will be as follows $$S(t) = \int_\delta \int_x A(x,\delta)e^{j(\gamma Gx + \delta)t} dx d\delta \quad (4)$$

The following study has been done in the rotating frame of reference with relaxation phenomena ignored as unessential.

If at the instant $t_1$, gradient Gx is switched off (termination of phase 2), induced from a target is a signal (phase 3)

$$S(t) = \int_\delta \int_x A(x,\delta)e^{j(\gamma GxT2 + \delta t)} dx d\delta \quad (5)$$

wherein T2 is the duration of phase 2.

Then, in phase 4, a sample is exposed to a so-called 180° pulse, the result being an inducing signal (phase 5):

$$S(t) = \int_\delta \int_x A(x,\delta)e^{j(\pi - 2\delta(T2+T3) + \delta t - \gamma GxT2)} dx d\delta \quad (6)$$

wherein T3 is the duration of phase 3.

In a one-dimensional case, phase encoding is not effected, so the duration of phase 6 can be expected to be extremely short.

Figure 2:
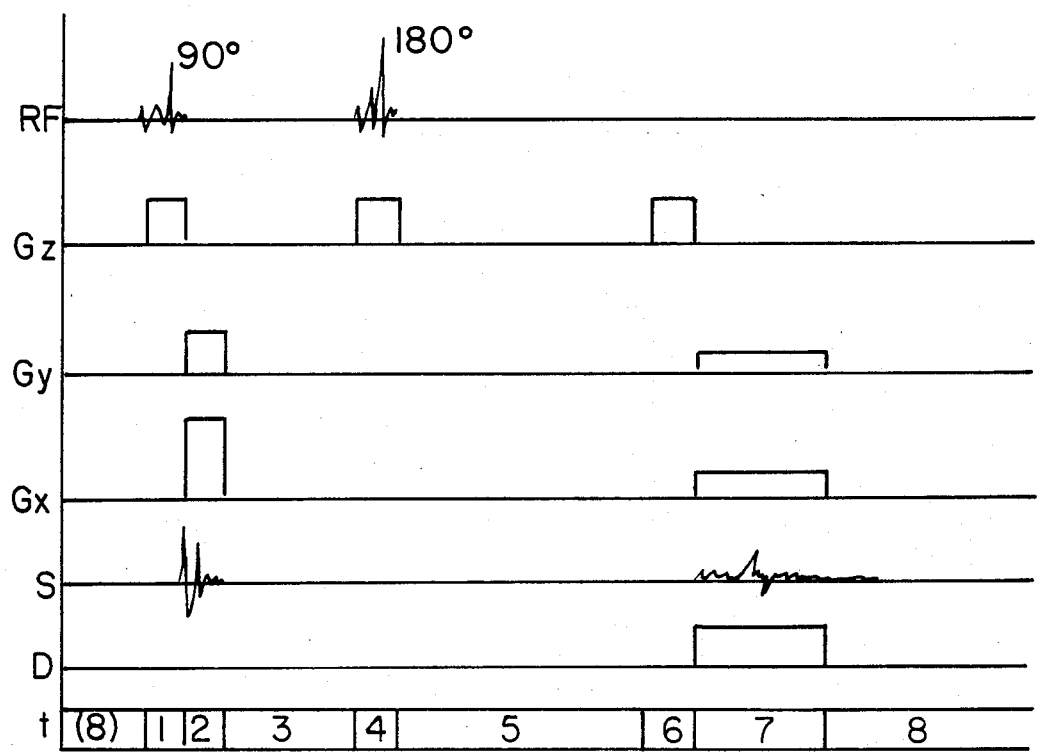
FIG. 2 shows the application of a method of the invention to a so-called projection-reconstruction imaging method.

In practice, a signal attenuates in phase 2 through the action of gradient fields to almost zero and, therefore, a signal is not particularly illustrated in FIGS. 1 and 2 during phases 3, 4, 5 and 6. Not until phase coherence returns in phase 7 through interaction between gradient field and 180° pulse, does the signal-to-noise ration notably increase.

In phase 7, there is again switched over a target a gradient Gx whose strength is not necessarily the same as in phase 2. Thus, the inducing signal will be $$S(t) = \int_\delta \int_x A(x,\delta)e^{j(\pi - 2\delta(T2+T3) + \delta t - \gamma GxT2 + \gamma G'xt')} dx d\delta \quad (7)$$

$t'$ = time counted from beginning of phase 7
$G'$ = strength of gradient Gx during phase 7

Written $(\pi - 2\delta(T2 + T3) + \delta t) = \phi(\delta)$ \quad (8)

$$S(t) = \int_\delta \int_x A(x,\delta)e^{j(\gamma G'xt' - \gamma GxT2 + \phi(\delta) + \delta t')} dx d\delta$$

Change of variable is effected $\gamma G'x + \delta = k; dx = \dfrac{dk}{\gamma G'}$ \quad (9)

$$S(t) = \frac{1}{\gamma G'} \int_\delta \int_k A'(k,\delta)e^{j(kt' - \gamma GxT2 + \phi(\delta))} dk d\delta$$

Signal is subjected to Fourier transformation.

$$Ft(S(t)) = \frac{1}{\gamma G'} \int_\delta \int_k A'(k,\delta)e^{j(\gamma GxT2 + \phi(\delta))} d\delta \quad (10)$$

If a number of signal collection sequences are effected by varying duration T3 of phase 3 so that $\phi(\delta)$ obtains equidistant values $\phi_n(\delta)$, result is $$Ft(S_n(t)) = \frac{1}{\gamma G'} \int_\delta A'(k,\delta)e^{-j\gamma GxT2}e^{j\phi_n(\delta)} d\delta \quad (11)$$

n = ordinal of signal collection.

By effecting the Fourier transformation towards ordinal n of a set of signals, the result will be $$F_n(Ft(S_n(t))) = \frac{1}{\gamma G'} A'(k,\delta) \quad (12)$$

I.e., the result will be nuclear spin density distribution in the direction of x and also spectral distribution.

In order to distinguish various components of spectrum from each other, the total duration of phases 3, 4 and 5 must exceed T, said T relating to expression $$T = \frac{2\pi}{2\delta_{min} B_0 \gamma} \quad (13)$$

wherein $B_0$ is the strength of external magnetic field.

For example, the chemical shift of resonance signals of water and fat in body tissues relative to each other is $\delta = 4$ ppm, which in approximately 0,5 Tesla magnetic field corresponds to the difference of circa 80 Hz. Thus, the total duration of phases 3, 4 and 5 should be circa 12 ms according to formula 13 but, since the $T_2$ relaxation time of tissues is typically 50 ... 100 ms, the width of the resonance peaks of tissues is circa 20 Hz. In order to make the peaks clearly distinguished from each other, the total duration of phases 3, 4 and 5 must be circa 40 ms. At a lower value of magnetic field $B_o$, the time required is naturally longer.

In the case of phosphor nucleus ($^{31}$P), it is biologically interesting to recognize the distribution of various phosphor compounds. In the cells, phosphor may be found as free, so-called inorganic phosphor (Pi), which in NMR spectroscopy is further divided into intracellular and extracellular phosphor, whose relative chemical shift is less than 1 ppm. Serving as energy supplies for a cell are phosphocreatinine (PCr) and adenosinetriphosphate (ATP) to which are bound also phosphor nuclei. The chemical shifts between various binding modes of phosphor are, if reference is the phosphor of phosphocreatinine: Pi+5 ppm and the phosphors of ATP −2, −7 and −16 ppm. Phosphor is registered by using e.g. field strength of 2, 3 Tesla, so the corresponding frequency shifts are Pi+200 Hz and the phosphors of ATP −80 Hz, −290 Hz and 640 Hz which means that in order to distinguish these the total duration of phases 3, 4 and 5 must be at least 20 ms as well as 180° and the timing step of sampling points must not exceed circa 0,5 ms. If the intracellular and extracellular phosphor are to be separated from each other, the total duration of phases 3, 4 and 5 must be at least 40 ms.

As apparent from the foregoing description, the collection of spectroscopic information is performed in a manner that the above pulse sequence is repeated several times and a resulting spin echo is recorded.

In practice, an inducing signal is collected by picking up samples thereof at successive instants, e.g. 128 or 256 samples. Most preferably the sampling instants or moments are set so that the time integral of the read gradient is constant between various sampling moments, i.e.

$$\int_{\Delta t_n} G dt = \text{constant}, \quad (14)$$

wherein
$\Delta t_n$ = time interval between sampling moments n and n+1.
G = read gradient Thus, if the strength of a gradient is for example doubled, the interval between sampling moments will be cut down to half.

Figure 6:
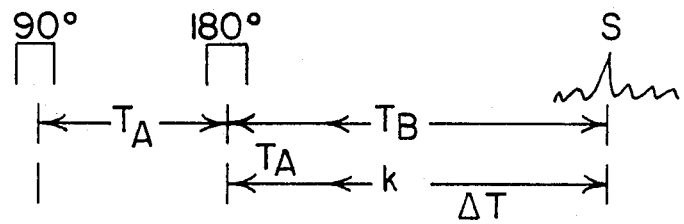
FIG. 6 illustrates the timing of the events of one embodiment of the invention.

FIG. 6 illustrates timing of the events of the embodiment shown in FIG. 1: a chemical shift as well as the inhomogeneities of a magnetic field effect the time $\Delta T$ and phase encode a signal S. By changing the time $T_A$ between a 90° pulse and a 180° pulse as well as the time $T_B$ between a 180° pulse and a signal but by maintaining the time $T_A + T_B$ between a 90° pulse and a signal constant, a set of signals $S_n$ will be collected. In the case of a two-dimensional target, it is plausible to use a gradient (Gy) orthogonal to numeral gradient in order to phase encode a nuclear system, just as shown in FIG. 1. Hence, if the resolution of an image in y-direction is m, a cluster of signals $S_n$ must be collected m times while varying the time integral of the phase encoding gradient Gy. If then the pulse repetition interval is 1 s, imaging time will be m×n seconds, i.e. if m=64 and n=8, said imaging time will circa 8 minutes.

FIG. 1 also illustrates confinement of a target area by using so-called selective excitation. In phase 1, a Z-gradient Gz is switched over a target while, at the same time, said target is subjected to an excitation signal having a limited bandwidth. Thereby a slice of the target will be excited, the slice extending perpendicularly to z-direction and having a thickness directly proportional to the band width and inversely proportional to the strength of the gradient field. Likewise in phase 4, there is a gradient along Z-direction switched on to make also a 180° pulse selective. In practice, excitation pulses are not indefinitely long. For this reason, they have limited band widths and also the efficiency of excitation decreases over a definite distance at the edges of a slice. Thus, it is preferable to select the band widths of pulses and the strengths of gradient fields active in phases 1 and 4 in a manner that said 180° pulse excites a wider slice than the preceding 90° pulse.

The amplitude of the gradient along the Z-direction switched on in phase 6 is selected such that its time integral corrects the dephasing occurring in connection with said selective excitations. Said dephasing is minor in connection with the 180° pulse but considerable in connection with a selective 90° pulse.

Thus, the correction of phasing could be performed by switching after said selective 90° pulse but prior to the 180° pulse a gradient along Z-direction to such a value and for such a period of time that its time integral will be of the opposite sign but has an absolute value equal to the effective time integral of the Z-gradient at the time of said selective 90° pulse. The principle of phasing is as such known in the art from reference Hoult: Journal of Magnetic Resonance, Vol. 26, p. 165, 1977, cited here for this aspect.

The following advantages are gained by performing the phasing as shown in FIG. 1 after a 180° pulse. First of all, due to the edge portions of a slice, the action of a 180° pulse generates nuclear magnetic signal also outside a volume being analysed, producing undesired artifacts. In the described manner this signal is quickly attenuated by the action of a gradient field and, thus, it cannot disturb the actual image formation. Secondly, the current sources generating gradient fields need not be bipolar, which reduces manufacturing costs of the apparatus. Thirdly, the necessary gradient switching speed become lower, which may be significant in terms of the safety of a patient.

When performing a complete three-dimensional mapping, said selective excitation actions are not absolutely necessary. In this case, the value of the selective gradient are zero in the excitation phase. In order to effect the mapping in the z-direction, a nuclear system must be phase encoded also in the z-direction. This is done in the same way as in the y-direction. The way this done by only using unipolar gradient pulses has been disclosed in reference Sepponen: FI patent application No. 824343. The method set out in this reference has been applied in y-phase encoding direction in FIG. 1. However, the invention is not limited to the phase encoding modes shown in the figures but, instead, phase encoding can be effected also by means of bipolar phase encoding gradient pulses prior to or after a 180° pulse.

Also in terms of timing, FIG. 1 should only be appreciated as a representation of one plausible sequence of actions and events according to the invention. For example, phase encoding and phase correction gradients can be switched on at a freely selected moment between the switching moments of 90° and 180° pulses as well as the read gradient. This does not affect the basic workability of the method.

As applications of the method according to the invention it is also possible to consider a case where a target, for some reason, is not intended to be mapped in all coordinate directions. Thus, the selectivity and phase coding operations in these directions are unnecessary and no gradient fields will be switched in these directions, i.e. a zero gradient field can be considered in such a case. Such applications include e.g. analysis and homogenization of a magnetic field as well as analysis of the spectral distribution of a sample in a test tube e.g. after centrifuging by means of a NMR spectrometer.

The method according to the invention can be further applied in a manner that excitation and coding procedures are concentrated successively on various sections of a target area. This serves to speed up the mapping of a three-dimensional target, which is delayed by a relaxation time $T_1$ of said target area. Such applications for producing a nuclear spin image, applicable in the present invention as well, have been described in the above-cited reference Sepponen FI application No. 824343.

The method of this invention is not obviously dependent on the direction of an area to be imaged and thus, although the figures suggest by way of example that the direction of selectivity be a direction perpendicular to z-direction, the selectivity can also be achieved in a direction perpendicular to x-, y- or some combinations of x,y,z-directions.

Thus, for example, in phase 1 of FIG. 1, x-gradient Gx is switched on and z-gradient is used e.g. the same way as x-gradient of FIG. 1. The result is a map comprising a slice-shaped area perpendicular to x-direction.

Figure 3:
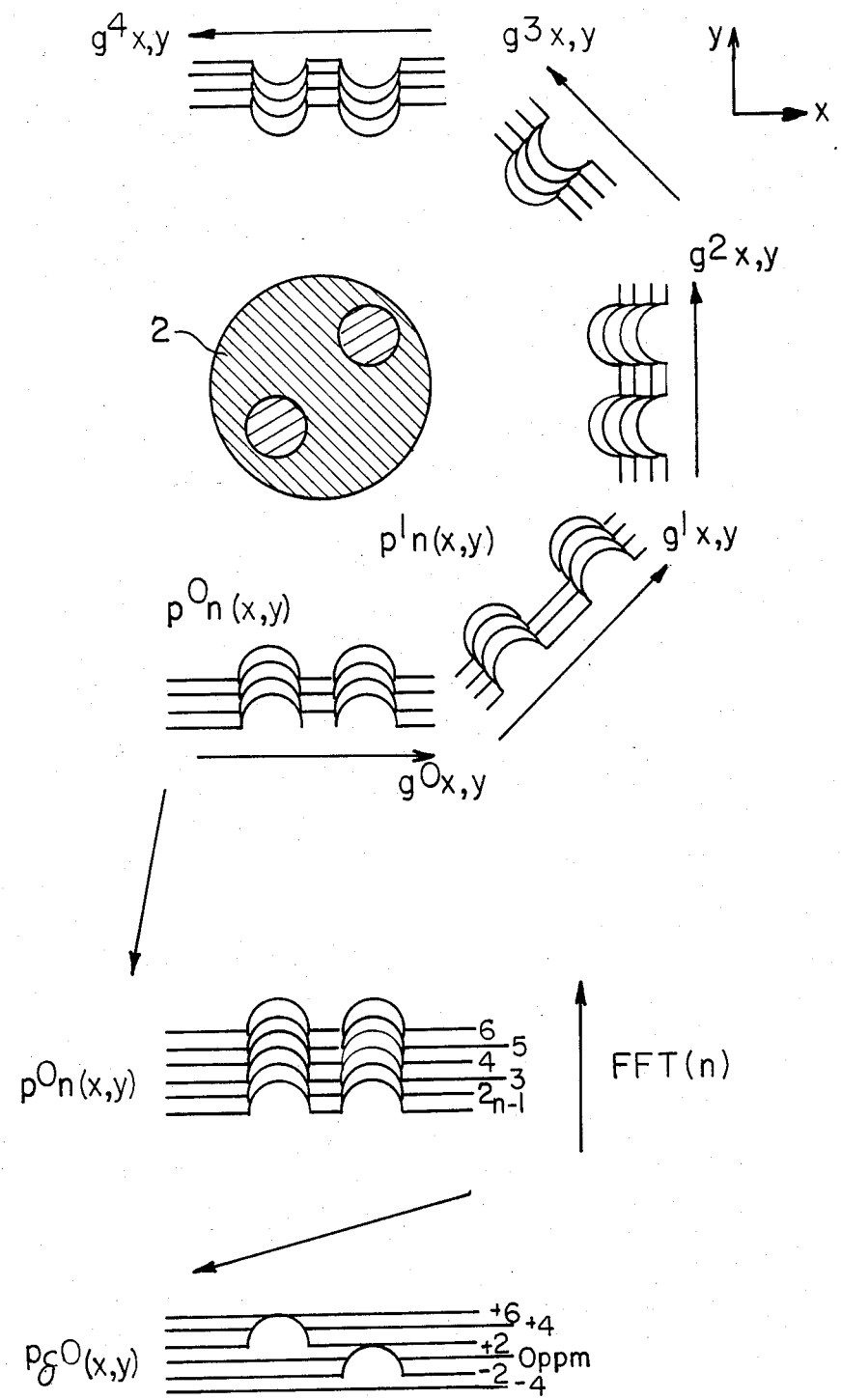
FIG. 3 illustrates image-producing principles in a projection-reconstruction method.

FIG. 2 illustrates the application of this invention to a projection-reconstruction method. To gradient Gz applies what has been said in connection with FIG. 1. In this case, a cluster of signals $S_n$ are collected from a target in each direction of a numeral gradient (m signals). The various directions are obtained by suitably changing gradients Gx and Gy whose resultant thus determines each given direction, as detailed in FIG. 3. The resulting set of signals are subjected to so-called Fast Fourier transformation (FFT) so as to produce a cluster of projections $P_n^m(xy) = F_n(F_t(S_n))$. Said set of projections is subjected to Fast Fourier transformation in direction n to produce from a target spectral projections $P \delta^n(x,y)$, which are necessary for image-building and used for reconstructing density distribution images for each spectral or shift value from a target area by means of the back projection algorithm. In FIG. 3, a target area 2 is presumed to include two concentrations of nuclei, the chemical shift in one being $-2$ ppm and in the other $+2$ ppm. A suitable method of performing back projection has been disclosed e.g. in reference Brooks et al: Radiology 117, 561, 1975.

Naturally, the invention can be applied so that time $T_A$ is constant and time $T_B$ is being varied in a manner that their sum $T_A + T_B$ is not constant (see FIG. 6). What must be considered here, though, is the effect of relaxation time $T_2$ on the results.

Figure 4:
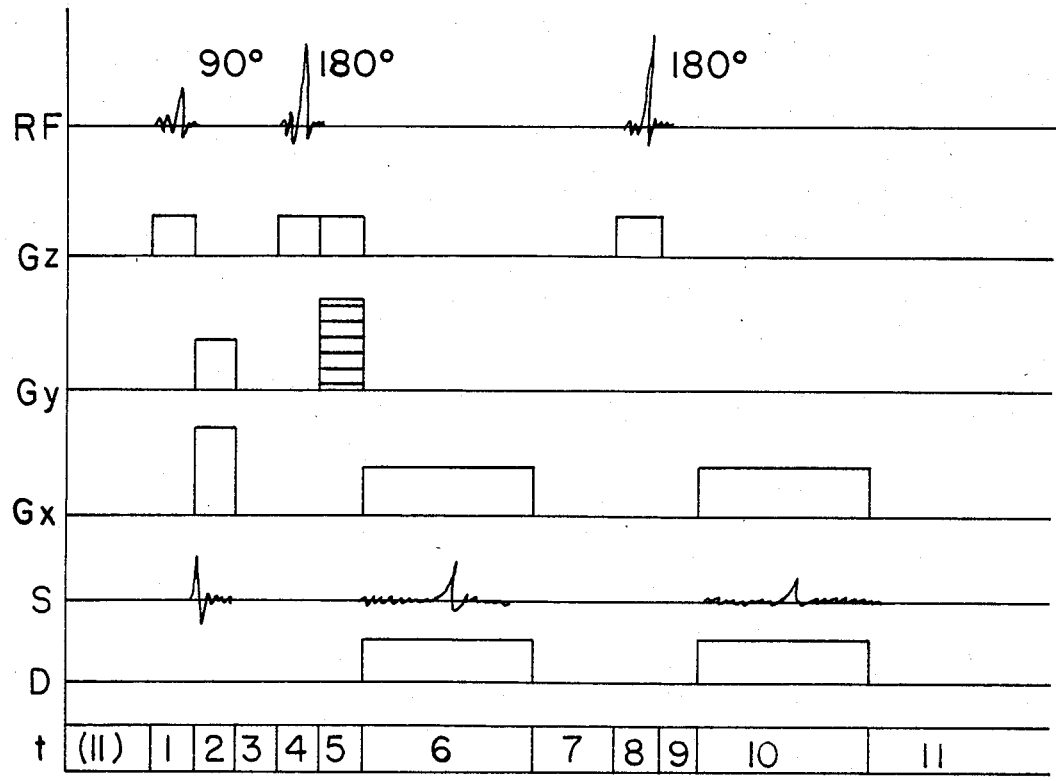
FIG. 4 shows the application of a method of the invention in a manner that the imaging time required for e.g. medical diagnostics is relatively short.

FIG. 4 shows by way of example one way of cutting down the imaging time in a Fourier method application by collecting during one pulse sequence two spin echoes, produced by using two different 180° pulses. The first echo is collected in a manner that the timings of phases are always constant and the second echo in a manner that the relative timing of an echo-producing 180° pulse (phase 8 in FIG. 4) and signal collection is varied exactly as described above. A signal collection time (phase 10) is however fixed relative to a 90° excitation pulse (phase 1).

Mapping of the distribution of the chemical spectrum of a target or the inhomogeneity of a magnetic field can be effected in the case shown in FIG. 4 by producing an image e.g. by means of a 2-dimensional Fourier transformation method by utilizing a complex difference or beat signal $S_1 - S_2$, wherein $S_1$ is a signal picked up in phase 6 and $S_2$ is a signal picked up in phase 10.

Figure 5A:
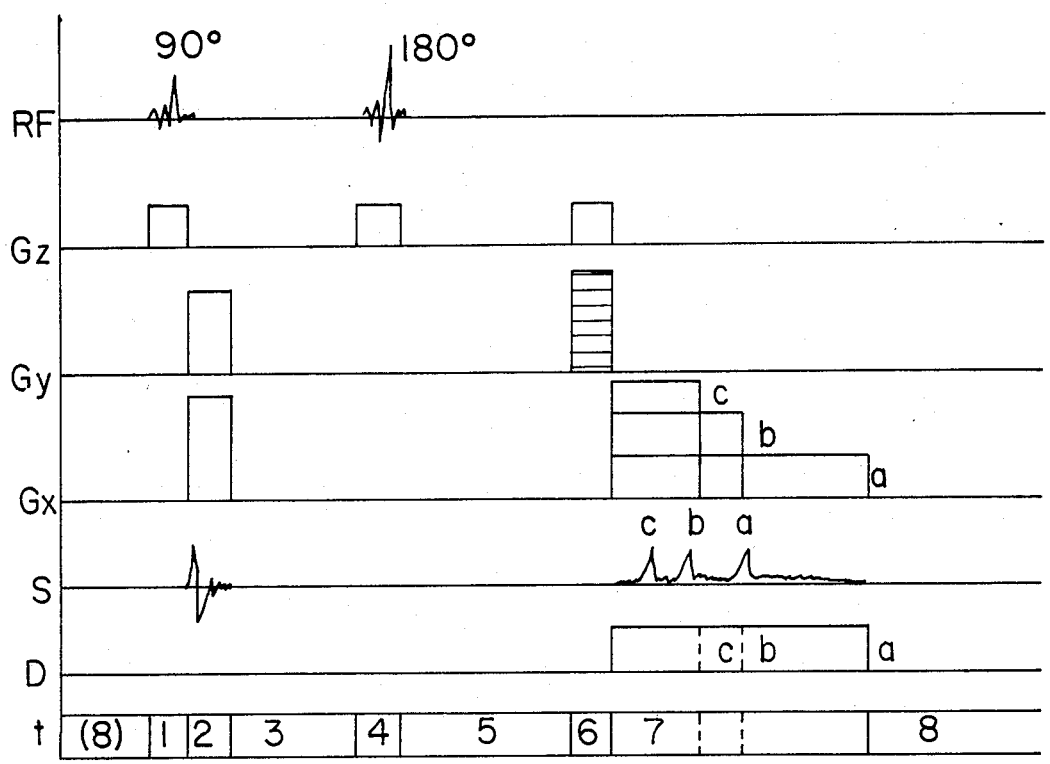
FIGS. 5a and 5b show a second and third application of a method of the invention which closely resemble each other.
Figure 5B:
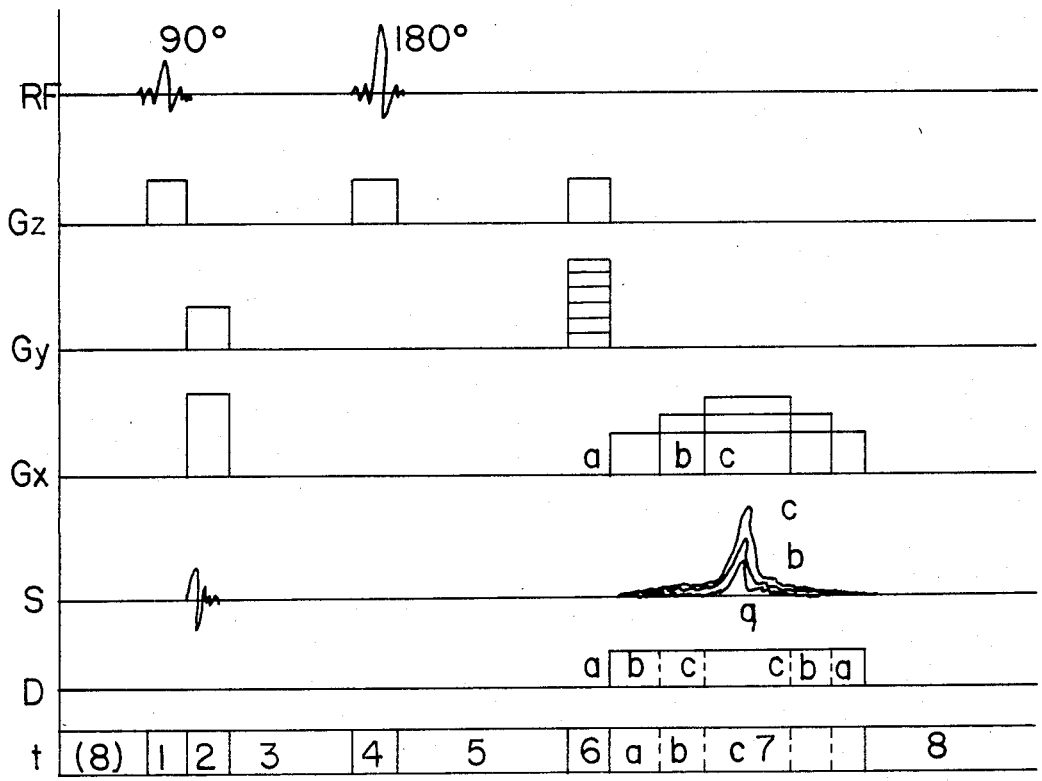

FIGS. 5a and 5b further set out two alternative and mutually similar means for mapping the chemical shift and the inhomogeneities of a magnetic field. In the illustrated methods, the strength of a read gradient is varied in signal collection phase 7 and, accordingly, the sampling frequency of signal collection. The sampling frequency is varied at various repetition times in a manner that the time integral $$\int_{\Delta t} G_x$$

of the read gradient during a sampling interval $\Delta t$ is always constant. At all repetition times, a certain selected sampling moment is kept at the distance of a constant time from a 180° pulse. This is the only aspect where the embodiments shown in FIGS. 5a and 5b differ from each other, in other words, in the case of FIG. 5a it is the first and in the case of FIG. 5b it is the middle sampling moment whose distance at various repetition times will be kept unchanged. The chemical shift or a inhomogeneity of the magnetic field will be found out by first subjecting the collected cluster of signals $S_n$ to Fourier transformation in terms of time and then to a transformation in the n-direction of an index indicating the ordinal of a sampling time.

In order to cut down the imaging time, a signal can be picked up successively from several echoes, e.g. from two echoes, one of which is always picked up by means of a constant read gradient and the other is picked up by changing the strength of a read gradient and, accordingly, the sampling frequency.

In the actual imaging apparatus it preferable to change also the limit frequency of low-pass filters performing the signal filtration, said change being effected in accordance with a target size and a gradient field to be used, as described in reference Sepponen: FI patent application No. 823444. This is to prevent the effect of a noise from a target beyond the signal bandwidth on the signal-to-noise ratio.

The above analysis can be expanded to multi-dimensional distributions A (X, Y, Z, δ). The analysis can also be effected in frequencies wherein the phase encoding is performed in one of the directions of a set of coordinates for producing an image. Examples of such image-producing methods include references Ernst: U.S. Pat. No. 4,070,611 and Edelstein et al: Physics in Medicine et Biology, July 1980, No. 4, pp. 751 . . . 756. It can be noted further that, although the above analyses have been performed on the basis of a so-called Fourier analysis, it may be preferable to use other prior art frequency analysis methods, particularly for producing the final spectral distribution (see equation 12). In practice, namely, in order to produce a spectral distribution, it is necessary to settle with relatively small values of n (<10), whereby it is preferable to use e.g. a so-called Autoregressive-Burgalgorithm. A summary of said other methods has been disclosed in reference Kay et al:

Proceedings of IEEE Vol. 69, No. 11, 1981, which is cited in this respect.

It has been presumed in the above description of operation that a basic magnetic field to use is extremely homogeneous. In practice, the homogeneity obtainable within an imaging area is poorer than $1:10^6$, usually $1:10^4$. Such field inhomogeneity leads to phase shifts in successive spin echoes corresponding to the chemical shift inherent of a material to be analysed and, therefore, renders the mapping of said chemical shift impossible.

Said errors caused by inhomogeneity can be corrected by effecting, according to the invention, mapping of a target which is completely homogeneous and by using the obtained image information distorted by in homogeneities of the field in order to correct the image of an actual target. This type of correction must be done if the inhomogeneity of a field is greater than a desired resolution in the spectrum of a chemical shift.

To put it more specifically, said correction is performed in a manner that the image information of a homogeneous target is stored in the memory means of a computer. In a three-dimensional case, for example, each point in a target is matched by an image point $\overline{K}(x,y,z)$, associated with a certain amplitude and phase $I/\phi$. The same way, in the image taken of a target, an image point is associated with a certain amplitude and phase $I'/\phi'$. Supposing that a field is so homogeneous that between two neighbouring image points a phase has not altered more than $2\pi$, an image can be produced from the distribution of the chemical spectrum of a target by performing the correction operation:

$$I''/\underline{\phi}'' = \frac{I'/\phi' - \phi}{I}, \quad (15)$$

wherein $I''/\phi''$ is the corrected phase and amplitude of image point $\overline{K}(x,y,z)$, $I'/\phi'$ is the non-corrected phase and amplitude of the same image point, and $I/\phi$ is the phase and amplitude of the same image point corresponding to a homogeneous target.

Another advantage gained by the method of this invention is that the spin echoes collected at various repetitions of a pulse sequence can be used for producing a high-quality anatomic image of a target area. This is because all collected signals can be utilized in averaging process.

Furthermore, the method can be applied during the installation stage of a nuclear spin imaging apparatus as follows: Placed in a nuclear spin imaging apparatus is a homogeneous target of which is produced an image by first using e.g. a very short shift step of a 180° pulse and a three-dimensional imaging method. Thus, an image is produced of the target, each point in said image being associated with a certain phase and amplitude. This information is used by the central computer of said apparatus by computing values for the coeefficients of a series development approximating the magnetic field distribution. Corresponding to this series development, the magnet of said apparatus is provided with so-called shimming coils for generating in the imaging area magnetic field gradients of the corresponding orders. Current is supplied to these coils by computer-controlled current sources whose inhomogeneity term is overcome as accurately as possible. Imaging is now repeated but by using perhaps a longer shift step of 180° pulse for an improved frequency resolution, the coefficients are computed and new compensation currents are set.

The described operation is repeated by a computer for a necessary number of times to provide a field as homogeneous as possible, whereafter said computer stores or displays the final image of said magnetic field.

Application of the method as described saves several working days, even weeks, in the installation of an apparatus and the application itself can be effected completely automatically by means of the actual imaging apparatus. The digital controls of shimming current sources can be removed if so desired and set the current sources fixedly to the values thereof computed as described above.

The method is also capable of securing temporal stability of the field of imaging equipment or of analysing the effect of ambient changes on the homogeneity of a magnetic field. It is further possible to find out the degree of magnetization of a material by imaging a sample that is homogeneous, e.g. a water vessel, and in which is immersed a piece of the material to be analysed. The sample is first imaged without the material to be analysed and thereafter with the material to be analysed. By means of these two images it is possible to analyse the magnetization of a material to be studied in the imaging field.

The invention is by no means limited to the above-described embodiments but a plurality of modifications thereof are conceivable within the scope of the annexed claims.

I claim:

1. A method for determination of at least one of the local distribution of the nuclear magnetic resonance spectrum of the nucleus of an atom to be analysed and the local distribution of inhomogeneities in the magnetic field, said method employing NMR nuclear spin imaging methods in which a target is placed in a magnetic field, said method comprising the steps of:
    (a) exciting the nuclei of a target area by applying a so-called 90° excitation pulse,
    (b) placing a magnetic field gradient over the target area for a selected period of time,
    (c) exposing the target area to a second excitation pulse, a so-called 180° pulse, for generating a spin echo,
    (d) placing over the target area a magnetic field gradient, a so-called read gradient, which has at least one component different from zero and parallel to said first magnetic field gradient,
    (e) recording the resulting spin echo in a manner that samples are picked up from the signal at successive sampling moments and setting the time interval between two successive sampling moments, preferably so that the time integral of said read gradient over this interval is constant, and
    (f) repeating the above-described procedure sequence a. . . e in a manner that at least some of the sampling moments, at which an inducing nuclear magnetic resonance signal is being picked up, will temporarily change relative to the said second excitation pulse.

2. A method as set forth in claim 1 further defined as comprising the following steps:
    a1 exposing the target to an alternating magnetic field whose strength, frequency and duration are selected in a manner that the nuclear magnetization generated by the isotope of a certain element of the target spins through 90° (a so called 90° pulse), this being called a first excitation pulse, b1 placing over the target area at least one magnetic field gradient, c1 when a certain first time delay has lapsed after the first excitation pulse, exposing the target to an alternating magnetic field whose strength, frequency and duration are such that nuclear magnetization of the previously excited target area spins through 180° (a so called 180° pulse) and called herein a second excitation pulse, d1 when a certain second time delay has lapsed after the first excitation pulse, placing over the target at least one magnetic field gradient, e1 recording a resulting spin echo, f1 repeating the above-described procedure sequence a1 . . . e1 for a desired number of times by simultaneously resetting the values of said first and second time delays in a manner that their difference alternates at various repetitions preferably equidistantly between certain maximum and minimum values, and g1 repeating the above-described procedure sequence a1 . . . f1 for a desired number of times by resetting in a per se known manner the values of said magnetic field gradients, e.g. strength, direction and time integral so that the recorded nuclear magnetic signals contain information about the nuclear density distribution of said target encoded in the frequency and phase of said signals.

3. A method as set forth in claim 2 further defined in that said procedures a1 . . . e1 are followed by preforming the repetition procedures required by steps f1 and g1 in reversed order, so that procedures g1 are effected first followed by procedures f1.

4. A method as set forth in claim 2, further defined in that the value of said first time delay is varied by equal intervals from a certain minimum value to a certain maximum value or vice versa and the value of said second time delay is kept constant.

5. A method as set forth in claim 2, further defined in that during said first excitation pulse there is a magnetic field gradient placed over the target for exciting in the object, a target area which is perpendicular to the direction of this gradient.

6. A method as set forth in claim 2, further defined in that during said second excitation pulse there is a magnetic field gradient placed over the target for exciting in the object, a target area which is perpendicular to the direction of this gradient.

7. A method as set forth in claim further defined as comprising the steps of:

a2 placing over the target a first magnetic field gradient and exposing the target to a first excitation pulse whose frequency, amplitude and duration are selected in a manner that nuclear magnetization spins through 90° (a so called 90° pulse), within the area excited in the target, b2 placing over the target a second magnetic field gradient in a manner that its time integral acquires a desired value between certain maximum and minimum values, and placing over the target a third magnetic field gradient in a manner that its time integral acquires a certain value, c2 after a certain first time delay, exposing the target area to a second excitation pulse whose frequency, amplitude and duration are selected in a manner that nuclear magnetization spins through 180° (a so called 180°-pulse), d2 placing over the target said second magnetic field gradient in a manner that its time integral acquires a desired value between certain maximum and minimum values, e2 when a certain second time delay has lapsed after said first excitation pulse, placing over the target said third magnetic field gradient to a desired value and recording a resulting spin echo, f2 repeating the above-described procedure sequence a2 . . . e2 for a desired number of times by simultaneously resetting the values of said first and second time delays in a manner that their difference varies between certain minimum and maximum values preferably by equal intervals, and g2 repeating the above-described procedure sequence a2 . . . f2 by so resetting the strengths and durations of said second magnetic field gradient switched on in steps b2 and d2 that the difference between the time integral of said gradient generated in step d2 and the time integral of said gradient generated in step b2 varies between certain maximum and minimum values preferably by equal intervals.

8. A method as set forth in claim 7 further defined in that said procedures a2 . . . e2 are followed by performing the steps required by procedures f2 and g2 in reversed order in a manner that first effected are procedures g2 and then procedures f2.

9. A method as set forth in claim 7, further defined in that the value of said second time delay is kept constant.

10. A method as set forth in claim 7, further defined in that during said second excitation pulse said first magnetic field gradient is switched to a desired value.

11. A method as set forth in claim 7, further defined in that said first magnetic field gradient is switched in steps b2 and d2 to such values and for such periods of time that the difference between their time integrals serves to compensate for the dephasing of the spin system generated in said excitation events.

12. A method as set forth in claim 1 further defined as comprising the steps of:

a3 placing over the target a first magnetic field gradient and exposing the target to a first excitation pulse whose frequency, amplitude and duration are selected in a manner that nuclear spin magnetization spins through 90° (a so called 90°-pulse), within an area excited in the target, b3 placing over the target a second magnetic field gradient in a manner that it has a certain strength and a certain direction, c3 when a certain first time delay has lapsed after said first excitation pulse, exposing the target area to a second excitation pulse whose frequency, amplitude and duration are so selected that the nuclear magnetization of said target area spins through 180° (a so called 180°-pulse), d3 when a certain second time delay has lapsed after said first excitation pulse, placing over the target said second magnetic field gradient, having the same direction as in step b3 and a certain strength, and recording a resulting spin echo, e3 repeating said procedure sequence a3 . . . d3 by simultaneously varying the values of said first and second time delays in a manner that their difference proceeds from a certain minimum value to a certain maximum value preferably by equal intervals, and f3 repeating said procedure sequence a3 . . . e3 by changing the direction of said second magnetic field gradient preferably equiangularly in a manner that the angle between the extreme directions is at least 180°.

13. A method as set forth in claim 12 further defined in that said procedures a3 ... d3 are followed by performing the repetition procedures required by steps e3 and f3 in reversed order by first effecting procedures f3 and then procedures e3.

14. A method as set forth in claim 12, further defined in that the value of said second time delay is kept constant.

15. A method as set forth in claim 12, further defined in that during said second excitation pulse said first magnetic field gradient is switched to its desired value.

16. A method as set forth in claim 12, further defined in that, in step d3 prior to recording of a spin echo, said first magnetic field gradient is placed on for such a period of time and to such values that the difference between the time integrals of this gradient during said steps is capable of compensating for the dephasing of the spin system generated in said first and second excitation events.

17. A method as set forth in claim 1 further defined as comprising the steps of
   a4 exposing the target to an alternating magnetic field whose frequency, strength and duration are so selected that the nuclear magnetization of the isotope of a certain element of the target spins through 90° (a so called 90°-pulse), this being called a first excitation pulse,
   b4 placing over the target at least one magnetic field gradient,
   c4 when a certain first time delay has lapsed after the first excitation pulse, exposing the target to an alternating magnetic field whose strength, frequency and duration are such that the nuclear magnetization of the previously excited target section spins through 180° (a so called 180°-pulse), this being called a second excitation pulse,
   d4 when a certain second time delay has lapsed after the first excitation pulse, placing over the target at least one magnetic field gradient,
   e4 recording a resulting spin echo preferably in a manner that a signal is picked up at certain discrete sampling moments of which there are a certain fixed number and whose interval is so selected that during the time between two successive sampling moments the time integral of said gradient is constant,
   f4 repeating said procedures sequence a4 ... e4 by varying the value of a magnetic field gradient applied in a step d4 in a manner that the time interval between the first and last sampling moments used in signal collection varies between certain minimum and maximum values, and
   g4 repeating the above-described procedures sequence a4 ... f4 for a desired number of times by varying in a per se known manner the strength, direction and time integral of said magnetic field gradients, so that the recorded nuclear magnetic signals contain information about the nuclear density distribution of the target as encoded in the frequency and phases thereof.

18. A method as set forth in claim 17 further defined in that said procedure steps a4 ... e4 are followed by performing procedures steps f4 and g4 in reversed order, so procedures g4 are effected first and procedures f4 thereafter.

19. A method as set forth in claim 17 further defined in that the value of said second time delay is kept constant.

20. A method as set forth in claim 17, further defined in that a certain sampling moment used in signal collection, as counted from the beginning of sampling process, is kept at the distance of a certain constant period of time from said second excitation pulse.

21. A method as set forth in claims 17, further defined in that during said second excitation pulse there is switched on a magnetic field gradient.

22. A method as set forth in claim 17, further defined in that prior to signal collection, after both the first and the second excitation pulses, there is switched on a magnetic field gradient for eliminating the dephasing of the spin system generated during the excitation pulses.

23. A method as set forth in claim 1 further defined in that the signals picked up are subjected to a Fourier transformation with respect to the time change between second excitation pulses and with respect to the sampling moments for determination of the spectral distribution or strength distribution of a magnetic field.

24. A method as set forth in claim 1 further defined in that signals picked up from a target are, selectively, corrected by means of an image produced on the basis of signals imaged from one of a homogeneous target and an otherwise known target.

25. A method as set forth in claim 1 further defined in that each repetition of the procedure sequences are sequentially effected on different sections of the target.

26. A method as set forth in claim 2 used to examine biological objects like any part of a human body and in order to analyze absolute or relative concentrations of the element of interest like hydrogen, phosphorous, sodium, potassium, fluorine, carbon etc. in order to assess for example the metabolic state and/or content of fatty/nonfatty tissues further defined in that the number of the repetitions of the gradient operations and the number of resetting operations of the first and second time delays are selected according to the imaging time and to the required spatial and spectral resolutions.

27. A method as set forth in claim 1 further defined as one for the homogenization of the field of a main magnet in a nuclear spin imaging assembly or NMR spectrometer having correction coils in which currents may be switched on such that said coils generate magnetic fields that minimize inhomogeneities in the main magnetic field, said method comprising the additional steps of
   mapping the inhomogeneities of the main magnetic field by means of a homogeneous or otherwise known target;
   determining the currents required by said coils from the mapping of the homogeneities;
   providing the currents so determined in said correction coils;
   repeating said mapping of the main magnetic field inhomogeneities for a desired number of times by changing various mapping parameters including the maximum and minimum duration of the interval between a second excitation pulse and sampling moments and the length and number of alteration steps for achieving improved resolving power and including changing the number of projections produced of the target from different directions or the number of phase encoding steps effected in different directions in order to achieve improved positional resolution.

28. A method as set forth in claim 1 further defined as one for determining magnetization of a material, said method further including the steps of positioning a sample of material to be analyzed in a predetermined location relative to a homogeneous or otherwise known target;

producing a fist magnetic field distribution map of the target by carrying out steps a . . . f;

altering one of the position of the sample material relative to said target or the amount of sample material for producing a second magnetic field distribution map;

comprising said first and second maps to obtain magnetic field values; and determining the magnetization of the material from the magnetic field values.

29. A method as set forth in claim 28, further defined in that one of said positions of a material to be analysed relative to said homogeneous or otherwise known target or one of the amounts of a material to be analysed is selected in a manner that the effect of magnetization of said material within the area of said target is as slight as possible.

* * * * *